US011646094B2

(12) United States Patent
Ware et al.

(10) Patent No.: US 11,646,094 B2
(45) Date of Patent: May 9, 2023

(54) MEMORY SYSTEM WITH ERROR DETECTION

(71) Applicant: Rambus Inc., San Jose, CA (US)

(72) Inventors: Frederick A. Ware, Los Altos Hills, CA (US); John Eric Linstadt, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/840,765

(22) Filed: Jun. 15, 2022

(65) Prior Publication Data

US 2022/0415428 A1 Dec. 29, 2022

Related U.S. Application Data

(63) Continuation of application No. 17/269,999, filed as application No. PCT/US2019/049203 on Aug. 30, 2019, now Pat. No. 11,393,550.

(60) Provisional application No. 62/731,817, filed on Sep. 14, 2018.

(51) Int. Cl.
  *G11C 29/42* (2006.01)
  *G11C 29/12* (2006.01)
  *G11C 29/18* (2006.01)
  *G11C 29/44* (2006.01)
  *G06F 11/10* (2006.01)

(52) U.S. Cl.
  CPC .......... *G11C 29/42* (2013.01); *G06F 11/1012* (2013.01); *G06F 11/1016* (2013.01); *G06F 11/1032* (2013.01); *G06F 11/1048* (2013.01); *G11C 29/1201* (2013.01); *G11C 29/18* (2013.01); *G11C 29/4401* (2013.01)

(58) Field of Classification Search
  CPC ..... G11C 29/42; G11C 29/1201; G11C 29/18; G11C 29/4401; G06F 11/1012; G06F 11/1016; G06F 11/1032; G06F 11/1048
  See application file for complete search history.

(56) References Cited

U.S. PATENT DOCUMENTS

| 7,203,889 B2 | 4/2007 | Oza et al. |
| 7,480,188 B2 | 1/2009 | Nakamuta et al. |
| 7,568,082 B2 | 7/2009 | Hoogerbrugge |

(Continued)

OTHER PUBLICATIONS

Notification of Transmittal of the International Search Report and the Written Opinion of the International Searching Authority, or the Declaration dated Nov. 12, 2019 re: Int'l Appln. No. PCT/US19/049203. 19 Pages.

*Primary Examiner* — Kyle Vallecillo
(74) *Attorney, Agent, or Firm* — Amsel IP Law PLLC; Jason Amsel (57) ABSTRACT

A memory controller generates error codes associates with write data and a write address and provides the error codes over a dedicated error detection code link to a memory device during a write operation. The memory device performs error detection, and in some cases correction, on the received write data and write address based on the error codes. If no uncorrectable errors are detected, the memory device furthermore stores the error codes in association with the write data. On a read operation, the memory device outputs the error codes over the error detection code link to the memory controller together with the read data. The memory controller performs error detection, and in some cases correction, on the received read data based on the error codes.

20 Claims, 9 Drawing Sheets

(56) References Cited

U.S. PATENT DOCUMENTS

| | | |
|---|---|---|
| 7,861,138 B2 | 12/2010 | Oh |
| 7,900,095 B2 | 3/2011 | Koguchi et al. |
| 8,250,328 B2 | 8/2012 | Farrell et al. |
| 8,417,901 B2 | 4/2013 | Lin |
| 8,479,071 B2 | 7/2013 | Takaku |
| 8,924,613 B2 | 12/2014 | Yamamoto |
| 9,904,609 B2 | 2/2018 | Miomo |
| 2007/0079212 A1* | 4/2007 | Har-Chen ........... G06F 11/1044 714/758 |
| 2008/0155378 A1 | 6/2008 | Amidi |
| 2008/0225603 A1 | 9/2008 | Hein |
| 2008/0235558 A1 | 9/2008 | Normoyle et al. |
| 2009/0327800 A1* | 12/2009 | Kim ................... G06F 11/1044 714/5.11 |
| 2011/0041016 A1 | 2/2011 | O'Connel |
| 2016/0179612 A1* | 6/2016 | Jokinen ................... G06F 13/28 714/807 |
| 2018/0293129 A1 | 10/2018 | Aberl et al. |

* cited by examiner

MEMORY SYSTEM WITH ERROR DETECTION

CROSS-REFERENCE TO RELATED APPLICATIONS

This application is a continuation of U.S. patent application Ser. No. 17/269,999, now U.S. Pat. No. 11,393,550, entered into the U.S. on Feb. 19, 2021 as a U.S. National Phase Entry under 35 USC 371 of PCT Application No. PCT/US2019/049203 filed on Aug. 30, 2019, which claims the benefit of U.S. Provisional Application No. 62/731,817 filed on Sep. 14, 2018, each of which are incorporated by reference herein.

BACKGROUND

In a memory system, a memory controller can write data to a memory device and read data from the memory device. Various conditions may lead to data errors in the data operated on by the memory system.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

A memory controller generates error codes associated with write data and a write address and provides the error codes over a dedicated error detection code link to a memory device during a write operation. The memory device performs error detection, and in some cases correction, on the received write data and write address based on the error codes. In an embodiment, error detection on the memory device may involve only a simple parity check. If no uncorrectable errors are detected, the memory device furthermore stores the error codes in association with the write data. On a read operation, the memory device outputs the error codes over the error detection code link to the memory controller together with the read data. The memory controller performs error detection, and in some cases correction, on the received read data based on the error codes.

Figure 1:
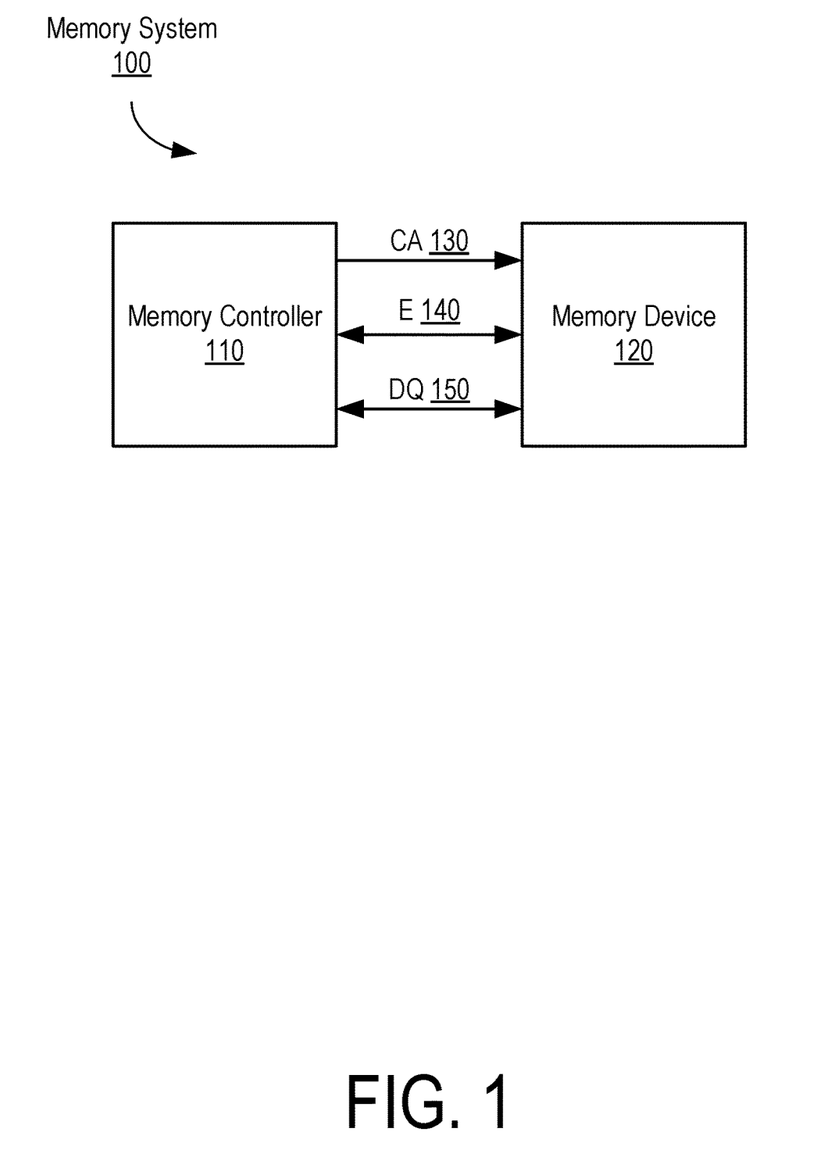
FIG. 1 is a block diagram illustrating an embodiment of a memory system.

FIG. 1 is a block diagram of a memory system 100. The memory system 100 comprises a memory controller 110 and a memory device 120. The memory controller 110 and the memory device 120 are coupled by a command/address (CA) link 130, an error detection code (E) link 140, and a data (DQ) link 150. In a write operation, the memory controller 110 transmits a write command and a memory address over the command/address link 130 to the memory device 120 and transmits a data word over the data link 150 to the memory device 120. The memory device 120 receives the write command, the memory address, and the data word, and writes the data word to memory at the specified memory address. During a read operation, the memory controller 110 transmits a read command and a memory address over the command/address link 130 to the memory device 120. The memory device 120 receives the read command and the memory address, reads a data word from memory at the specified memory address, and transmits the data word to the memory controller 110.

Due to electrical interference that may occur during transmissions, one or more data errors (e.g., bit flips) may occur during transmission of the memory address from the memory controller 110 to the memory device 120 or during transmission of the data word to or from the memory device 120. Furthermore, data errors may occur while the data words are stored by the memory device 120. Thus, one or more bits of a data word may change in the time between being written to the memory device 120 and being read from the memory device 120.

To detect, and in some cases correct a limited number of bit errors, error codes may be generated by the memory controller 110 and transmitted to the memory device 120 during a write operation and stored by the memory device 120 together with the data word. The error code includes some number of check bits calculated from a message (e.g., a data word or command/address information) in a way that encodes some redundant information relating to the message such that a decoder can detect, and in some cases correct, a limited number of bit errors in the message. On a write operation, the error code is transmitted by the memory controller 110 to the memory device 120 over the error detection code link 150. The received error code may be processed by the memory device 120 to detect, or in some cases, correct a limited number of bit errors that occur during transmission of the memory address and/or the data word to the memory device 120. If an uncorrectable error is detected, the memory device 120 may request retransmission from the memory controller 110. Otherwise, the memory device 120 writes the error code to memory together with the data word. During a read operation, the memory device 120 outputs the stored error code over the error code detection link 150 to the memory controller 110 together with the requested data word. The memory controller 110 processes the error code to detect, and in some cases correct, an error that occurred while the data word was in storage or while the data word was in transport from the memory device 120 to the memory controller 110. The memory controller 110 can generate an output message indicative of an uncorrectable result in response to an uncorrectable error being detected. Otherwise, the memory controller 110 may output the read data.

Various components of memory system 100 described herein may be implemented, for example, as an integrated circuit (e.g., an Application-Specific Integrated Circuit (ASIC) or using a field-programmable gate array (FPGA), in software (e.g., loading program instructions to a processor from a non-transitory computer-readable storage medium and executing the instructions by the processor), or by a combination of hardware and software.

Figure 2:
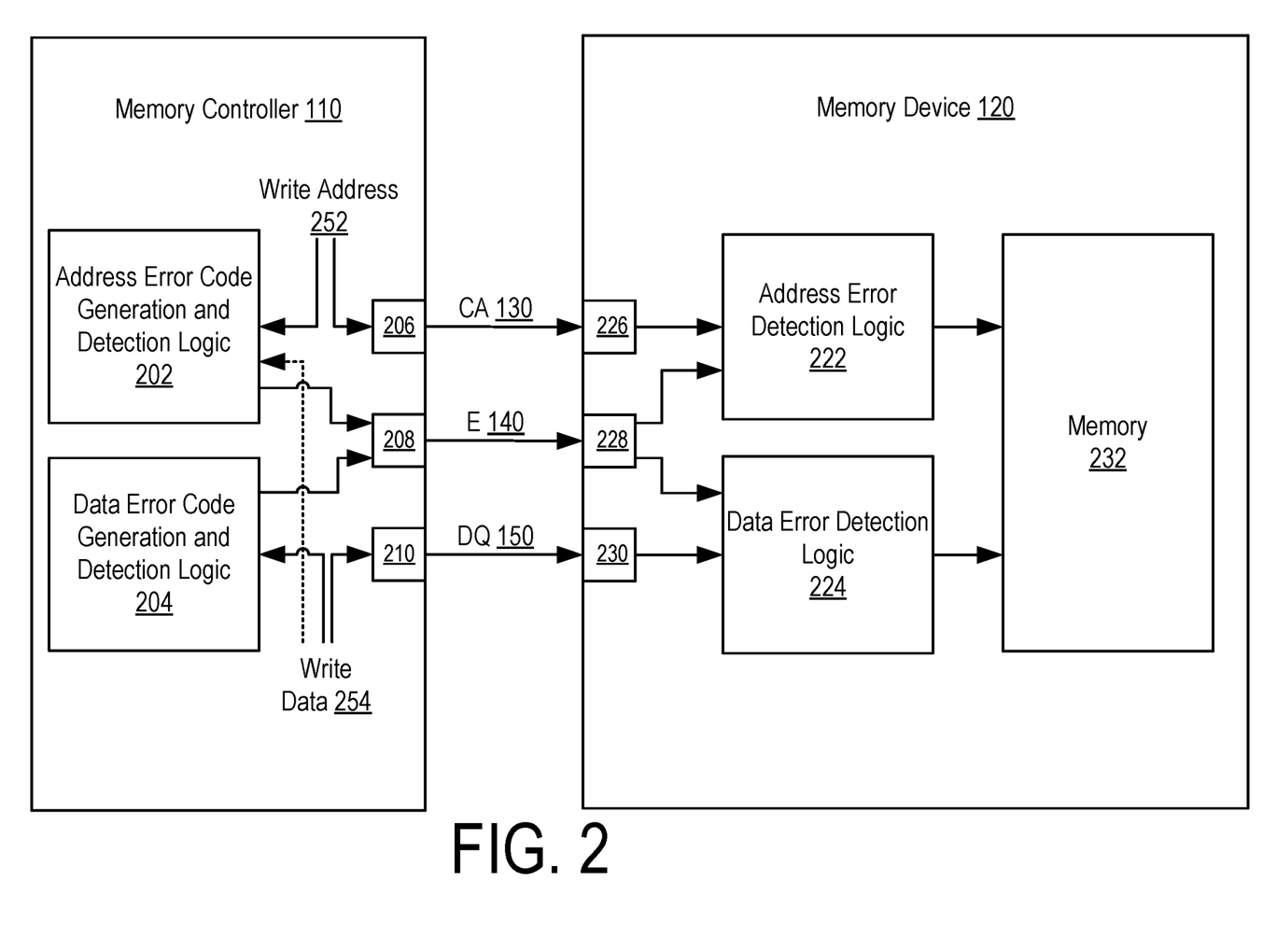
FIG. 2 is a block diagram illustrating a first example embodiment of the memory system performing a write operation.

FIG. 2 illustrates a more detailed embodiment of a memory system 100 and shows the flow of communications during a write operation. In this embodiment, the memory controller 110 comprises address error code generation and detection logic 202, data error code generation and detection logic 204, a command/address interface 206, an error detection code interface 208, and a data interface 210. The memory device 120 comprises address error detection logic 222, data error detection logic 224, a command/address interface 226, an error detection code interface 228, a data interface 230, and a memory 232. Other elements of the memory controller 110 and the memory device 120 are omitted for clarity of description.

The address error code generation and detection logic 202 receives a write address 252 to be transmitted by the command/address interface 206 over the command/address link 130, and generates a write address error code encoding error information of the write address. The write address 252 may be generated internally by the memory controller 110 or received from an external source. In one embodiment, the address error code generation and detection logic 202 generates a 6 bit cyclic redundancy code (CRC) from a 32 bit write address that encodes check bits from which two bits of error in the 32 bit write address can be detected. In an embodiment, one of the bits of the write address error code may comprise a parity bit that encodes parity information of the write address to enable a decoder to detect a single bit error in the write address by performing a simple parity check as described below. The address error code generation and detection logic 202 outputs the write address error code to the error code detection interface 208.

The data error code generation and detection logic 204 receives write data 254 to be transmitted by the data interface 210 over the data link 150, and generates a write data error code encoding error information of the write data. The write data 254 may be generated internally by the memory controller 110 or received from an external source. In one embodiment, the data error code generation and detection logic 204 generates a 10 bit error correction code from a 256 bit data word that encodes check bits from which one bit of error of the 256 bit data word can be corrected and from which two bits of error of the 256 bit data word can be detected (i.e., a single error correction/double error detection code (SECDED code)). In an embodiment, one of the bits of the write data error code may comprise a parity bit that encodes parity information of the write data to enable a decoder to detect a single bit error in the write data by performing a simple parity check as described below. The data error code generation and detection logic 204 outputs the write data error code to the error detection interface 208.

The command/address interface 206 outputs the write address 252 to the memory device 120 over the command/address link 130. The command/address interface 206 may additionally output other command or control messages over the command/address link 130 in association with the write operation such as, for example, the write command or various control information. In an embodiment, the command/address interface 206 serializes the write command, write address 252, and/or other control information. For example, the command/address interface 206 may serialize 48 bits of command and address information (including the 32 bit write address) into eight command/address words that are each 6 bits wide for outputting over a 6 bit wide command/address link 130.

The data interface 210 outputs the write data 254 to the memory device 120 over the data link 150 in association with the write operation. In an embodiment, the data interface 210 serializes the write data 254. For example, the data interface 210 serializes 256 bits of the write data 254 into 16 data words that are each 16 bits wide for outputting over a 16 bit wide data link 150.

The error detection code interface 208 receives the write address error code from the address error code generation and detection logic 202 and receives the data error code from the data error code generation and detection logic 204, and outputs a combined error code (e.g., by concatenating or otherwise combining the writes address error code and the data error code) to the memory device 120 over the error detection code link 140. In one embodiment, the error detection code interface 208 serializes the combined error code and outputs one bit of the combined error code at a time over a one bit wide error detection code link 140. The error detection code interface 208 may output the combined error code in parallel with the data interface 210 outputting the write data. For example, the error detection code interface 208 may output a single bit of the combined error code together with each 16 bit data word of the write data 254.

The command/address interface 226 of the memory device 120 receives the command/address information from the command/address link 130 and provides the write address to the address error detection logic 222. In an embodiment, the command/address interface 226 de-serializes the received write command, write address, and/or other control information. For example, the command/address interface 226 de-serializes each 6 bit command/address word to reconstruct the 48 bit command/address information that includes the 32 bit write address.

The data interface 230 of the memory device 120 receives the write data from the data link 150 and provides the write data to the data error detection logic 224. In an embodiment, the data interface 230 de-serializes the write data. For example, the data interface 230 de-serializes each 16 bit data word of the write data to reconstruct the 256 bit write data.

The error detection code interface 228 of the memory device 120 receives the combined error code including the write data error code and the write address error code from the error detection code link 140 and de-serializes the combined error code to obtain the write data error code and the write address error code. The error detection code interface 228 provides the write address error code to the address error detection logic 222, and provide the write data error code to the data error detection logic 224.

The address error detection logic 222 receives the write address and the write address error code and detects one or more errors in the write address. For example, in one embodiment, the address error detection logic 222 comprises a decoder for decoding a 32 bit write address and 6 bit CRC to detect up to two bits of error.

In an alternative embodiment, the address error detection logic 222 comprises a decoder for decoding the write address and write address error code to detect only a single bit of error. In this embodiment, the address error detection logic 222 may comprises simple parity check logic to determine if a parity bit of the write address error code matches a computed parity of the received write address. Here, the parity bit may comprise a predefined bit of a multi-bit write address error code (e.g., the 6 bit CRC) that encodes parity information.

The data error detection logic 224 receives the write data and the write data error code and detects one or more errors, or in some cases corrects one or more errors, in the write data. For example, in one embodiment, the data error detection logic 224 comprises a decoder for decoding 256 bits of write data and a 10 bit write data error code to detect up to two bits of error and to correct up to one bit of error.

In an alternative embodiment, the data error detection logic 224 comprises a decoder for decoding the write data and write data error code to detect only a single bit of error. In this embodiment, the data error detection logic 224 may comprises simple parity check logic to determine if a parity bit of the write data error code matches a computed parity of the received write data. Here, the parity bit may comprise a predefined bit of a multi-bit write data error code (e.g., the 10 bit SECDED code) that encodes parity information.

If either the address error detection logic 222 or the data error detection logic 224 detects an uncorrectable error, the memory device 120 may issue a request (not shown) to the memory controller 110 to cause the memory controller 110 to retransmit the write command and write data. In an embodiment, the request may be issued via the error detection code link 140 or via a separate link (not shown) between the memory device 120 and the memory controller 110. Otherwise, the memory device 120 writes the write data to the memory 232 at the memory address and furthermore writes the combined error code (including the write address error code and the write data error code) to the memory 232 in association with the write data.

In embodiments where the address error detection logic 222 and/or the data error detection logic 224 include only parity check logic for detecting single bits of error in the write address and the write data respectively, the memory 232 may store the full write address error code and the full write data error code even though only the respective parity bits of these error codes are used for error detection by the memory device 120. These embodiments beneficially enable limited error detection on the memory device 120 without requiring complex error detection or correction logic on the memory device 120. Furthermore, in these embodiments, more complex error detection and/or correction can be performed on the memory controller 110 during read operations as described below while performing only parity checks on the memory device 120.

Figure 3:
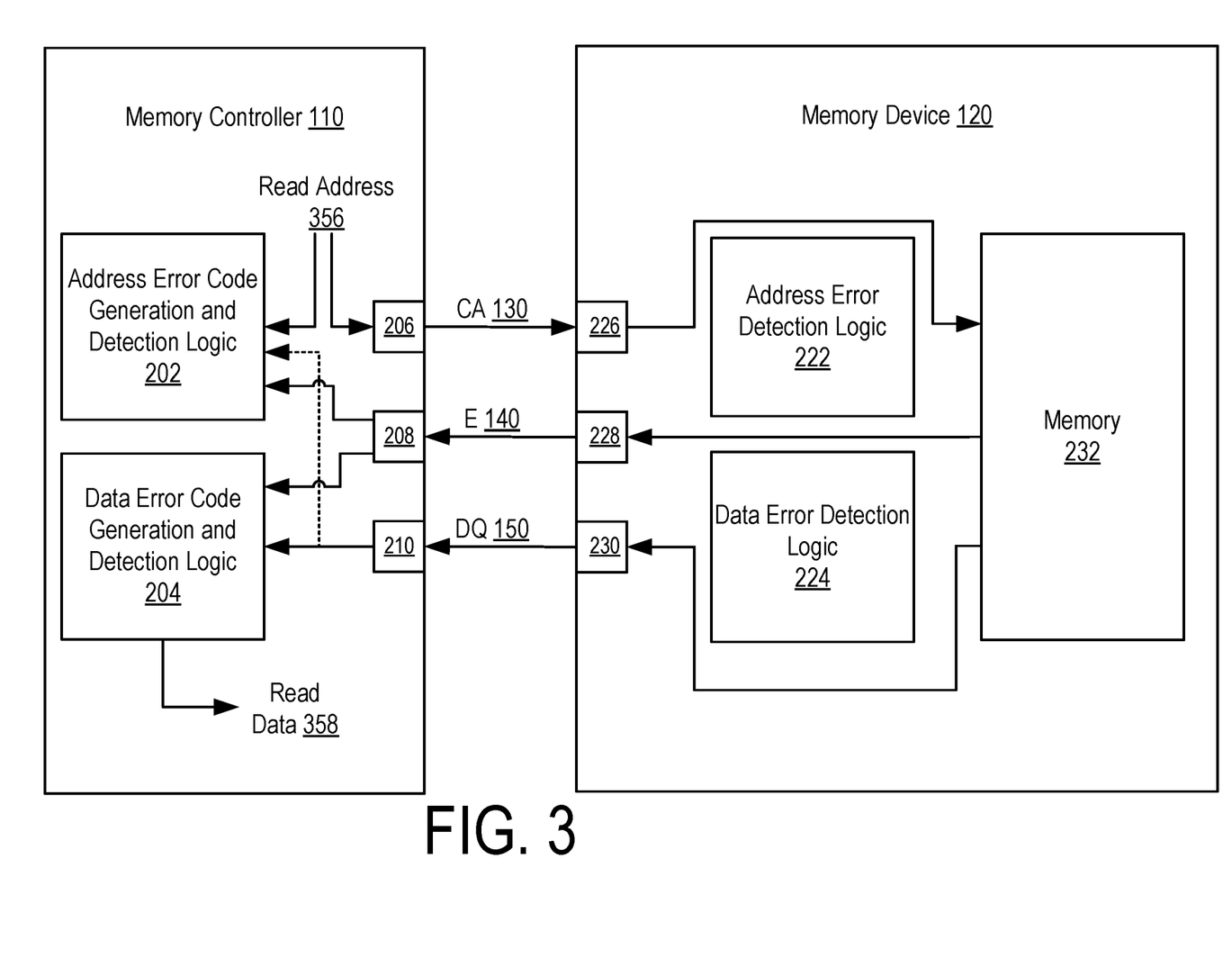
FIG. 3 is a block diagram illustrating the first example embodiment of the memory system performing a read operation.

FIG. 3 illustrates the memory system 100 showing the flow of communications during a read operation. Here, the command/address interface 206 sends a read command, a read address 356, and/or other control information to the memory device 120 over the command/address link 130. The read address 356 may be generated internally by the memory controller 110 or received from an external source. The command/address interface 206 may serialize the read command, read address 356, and/or other control information in the same manner described above. The command/address interface 226 of the memory device 120 receives and de-serializes the read command, read address, and/or other control information. The memory 232 then reads a data word and corresponding combined error code (e.g., a read address error code and a read data error code) from the read address and provides the read data and the combined error code to the data interface 230 and the error detection code interface 228 respectively of the memory device 120. The data interface 230 serializes the read data in the same manner described above and transmits the serialized read data over the data link 150 to the memory controller 110. In parallel with the read data, the error detection code interface 228 serializes the combined error code in the same manner described above, and transmits the combined error code over the error detection code link 140 to the memory controller 110. The data interface 210 receive and de-serialize the read data and provides the read data to the data error code generation and detection logic 204. The error detection code interface 208 of the memory controller 110 receives and de-serializes the combined error code and recovers the read address error code and the read data error code. The error detection code interface 208 provides the read address error code to the address error code generation and detection logic 202, and provides the read data error code to the data error code generation and detection logic 204.

The address error code generation and detection logic 202 receives the read address transmitted by the command/address interface 206 and the read address error code. The address error code generation and detection logic 202 include a decoder for decoding the read address and the read address error code to detect one or more errors. For example, the read address error code may comprise a 6 bit cyclic redundancy code corresponding to a 32 bit read address that enables the address error code generation and detection logic 202 to detect up to two bits of error.

The data error code generation and detection logic 204 receives the read data and the read data error code. The data error code generation and detection logic 204 comprises a decoder to decode the read data and the read data error code to detect, or in some cases correct, one or more errors. For example, the read data error code may comprise a 10 bit SECDED code corresponding to 256 bits of read data that can detect and correct a single bit error or detect a double bit error.

If the memory controller 110 detects an uncorrectable error, the memory controller 110 may output an error message indicative of an uncorrectable result. Otherwise, the data error code generation and detection logic 204 may output the read data 358 to an internal component of the memory controller 110 or to an external device.

Figure 4:
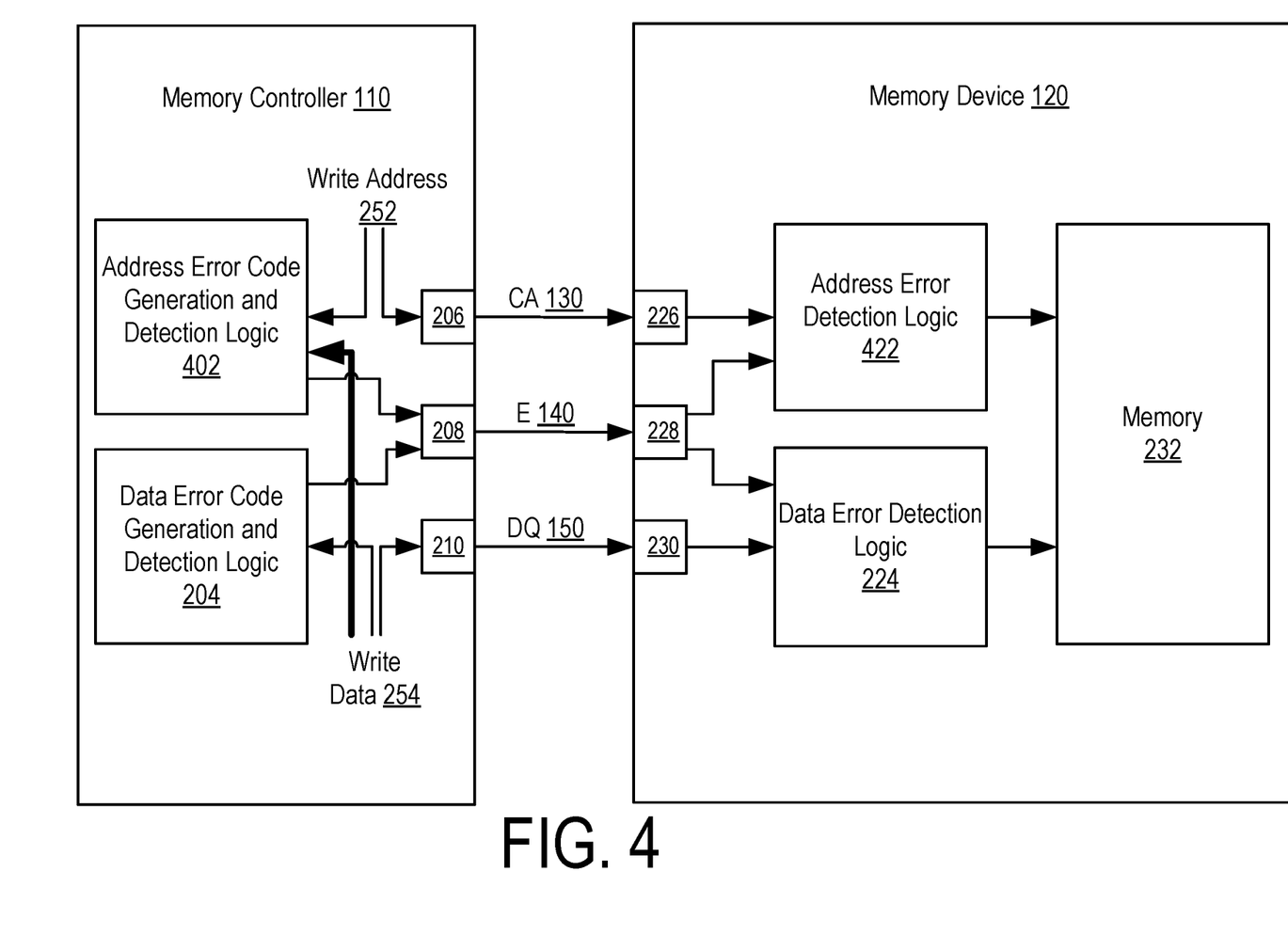
FIG. 4 is a block diagram illustrating a second example embodiment of the memory system performing a write operation.

FIG. 4 illustrates an alternative embodiment of a memory system 100 and shows the flow of communications during a write operation. In this alternative embodiment, the memory controller 110 includes address error code generation and detection logic 402 that generates an address error code that includes check bits encoding error information relating to both a write memory address 252 and the write data 254 (instead of being only based on the write address 252). For example, in one embodiment, the address error code generation and detection logic 402 receives a 32 bit write address and receives two 256 bit data words of the write data 254 for writing to aligned memory blocks of the memory 232. The address/data error code generation and detection logic 402 generates an 11 bit cyclic redundancy code that enables detection of up to three bits of error in the 32 bit write address, the two 256 bit data words, and the 11 bit address error code. In an embodiment, the 11 bit CRC may include a predefined bit that encodes parity information of the combined bits of the write data and the write address in order to enable the memory device 120 to detect a single bit of error using only the parity bit of the 11 bit CRC as described below. The data error code generation and detection logic 204 may generate a write data error code (e.g., a 10 bit SECDED code for each 256 bit data word) in the same manner as described above.

The address error detection logic 422 of the memory device 120 receives the write address, the write data, and the write address error code, and detects, or in some cases corrects, one or more errors. For example, in one embodiment, the address error detection logic 422 uses the full write address error code (e.g., an 11 bit CRC) to detect multiple bits (e.g., up to 3 bits) of error that may be in either the memory address or the write data. Alternatively, the address error detection logic 422 of the memory device 120 may perform parity check on the write address and the write data using only a single bit of the write address error code that encodes parity information to detect a single bit of error.

The data error detection logic 224 of the memory device 120 may function as described above. For example, in one embodiment, the data error detection logic 224 detects, or in some cases corrects, one or more bits of error in the receive write data based on the full data error detection code. Alternatively, the data error detection logic performs a parity check on the write data to detect only a single bit of error based on a parity bit of the data error detection code that encodes parity information.

The memory 232 may store the 11 bit address error code across two aligned memory blocks corresponding to the two 256 bit write data words. For example, a first memory block may store a first 256 bit data word, a corresponding 10 bit SECDED code, and 6 bits of the 11 bit address/data error code, while a second memory block may store the second 256 bit data word, a corresponding 10 bit SECDED and the remaining 5 bits of the 11 bit address/data error code.

Figure 5:
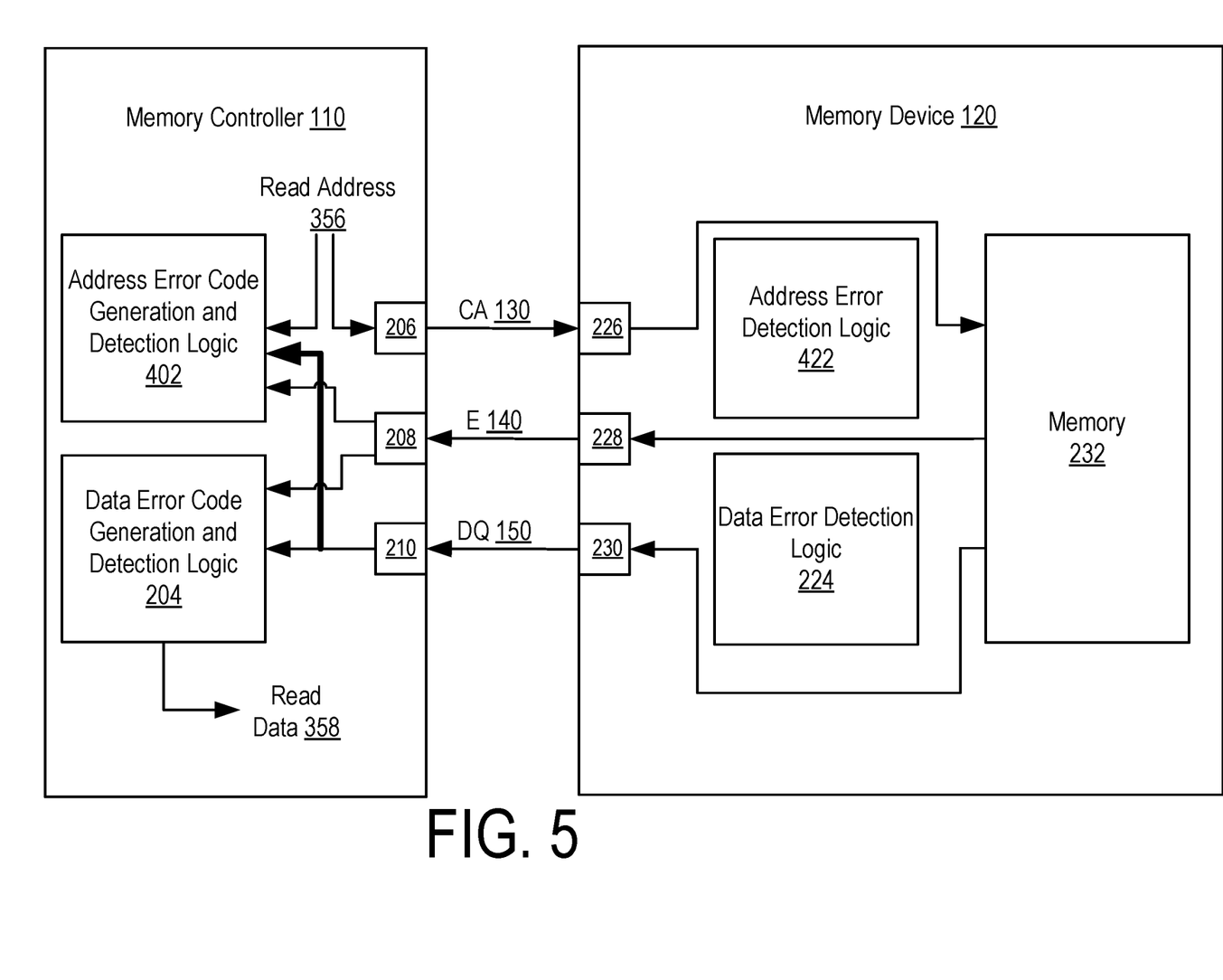
FIG. 5 is a block diagram illustrating the second example embodiment of the memory system performing read operation.

FIG. 5 illustrates the alternative embodiment of the memory system 100 showing the flow of communications during a read operation. Here, the read data is read from a pair of aligned memory blocks (e.g., two 256 bit data words) and transmitted to the memory controller 110 together with a corresponding pair of read data error codes (e.g., a pair of 10 bit SECDED codes) and a read address error code (e.g., an 11 bit CRC) encoding information associated with both the memory address and the pair of data words in the read data. The address error code generation and detection logic 402 obtains the read address 356, the read data, and the read address error code and detects one or more errors in a code word corresponding to bits of the read address, the read data, and the read address error code (e.g., detects up to three bits of error). The data error code generation and detection logic 404 obtains the read data (e.g., a pair of 256 bit data words) and the read data error codes (e.g., a pair of 10 bit SECDED codes), and detects, or in some cases corrects, one or more bit errors in a code word corresponding to the bits of the read data and the read data error codes. If an uncorrectable error is detected, the memory controller 110 generates an output message indicating an uncorrectable result.

The embodiment of FIGS. 4-5 beneficially provides additional detection of errors in the data and therefore enables more robust operation of the memory system 100. Furthermore, the additional benefit can be achieved primarily through changes to the memory controller 110 without requiring significant additional hardware on the memory device 120. This enables the benefit to be achieved at relative low cost because a single memory controller 110 can typically control a large number of memory devices 120.

Figure 6:
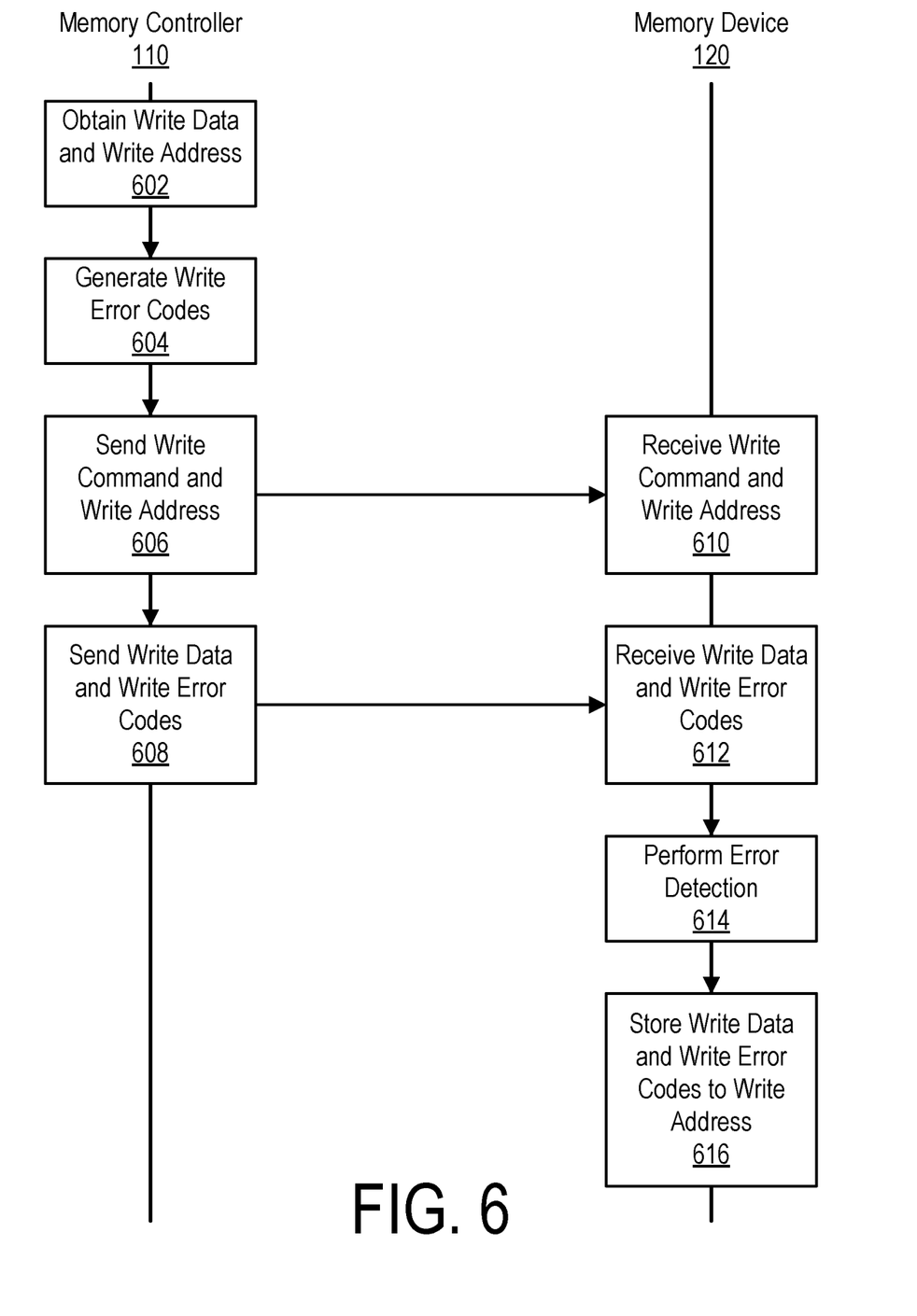
FIG. 6 is a flowchart illustrating an embodiment of a process for performing a write operation.

FIG. 6 illustrates an embodiment of a process for performing a write operation in accordance with the embodiments described above. A memory controller 110 obtains 602 write data and a write address for performing the write operation. The memory controller 110 generates 604 write error codes, which may include an address error code encoding error information of the memory address (and optionally the write data), and a write data error code encoding error information of the write data. The memory controller 110 sends 606 the write command and the write address to the memory device 120. The memory controller 110 then sends 608 the write data and the write error codes to the memory device 120. The memory device 120 receives 610 the write command and the write address and receives 612 the write data and the write error codes. The memory device 120 performs 614 an error detection. The error detection may comprise, for example, parity checks of the write data and the write address, or may comprise more complex error detection and/or correction using CRC, SECDED, or other error detection codes. The memory device 120 then stores 616 the write data and write error codes to the write address.

Figure 7:
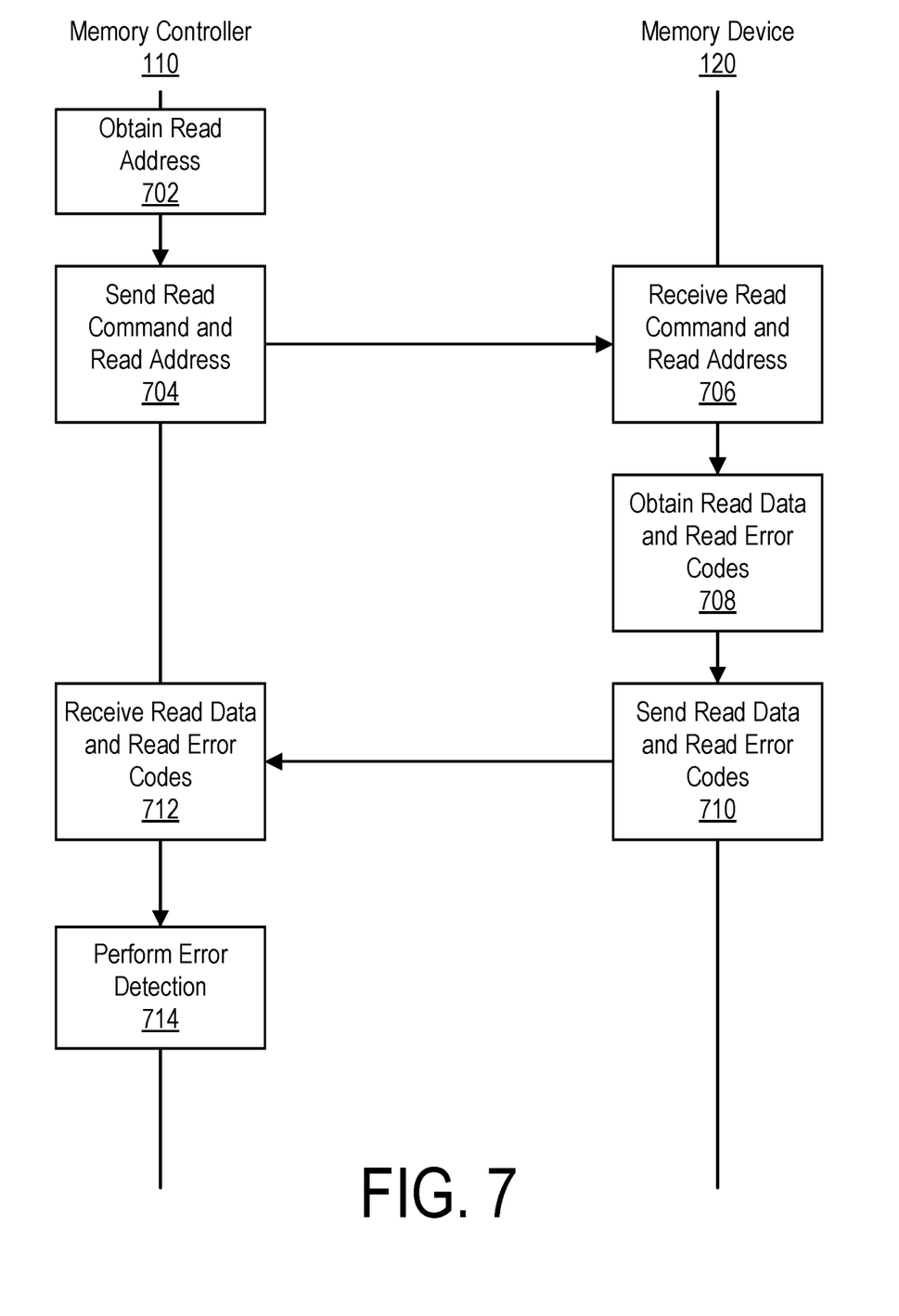
FIG. 7 is a flowchart illustrating an embodiment of a process for performing a read operation.

FIG. 7 illustrates an embodiment of a process for performing a read operation in accordance with the embodiments described above. A memory controller 110 obtains 702 a read address and sends 704 a read command and the read address to the memory device 120. The memory device 120 receives 706 the read command and the read address. The memory device 120 obtains 708 the read data and read error codes stored to the read address. The memory device 120 sends 710 the read data and the read error codes to the memory controller 110. The memory controller 110 receives 712 the read data and the read error codes and performs 714 an error detection to detect or in some cases correct, a limited number of errors in the read data or read error codes.

In an embodiment, the memory controller 110 and/or the memory device 120 may track a rate of uncorrectable errors in the write data and/or the read data and may adjust a refresh rate of the memory device 120 based on the error rate. For example, the refresh rate may be increased upon the error rate exceeding a threshold.

In an embodiment, the memory device 120 can be optionally configured in a compatibility mode to be compatible with a memory controller that does not provide error detection or correction logic. Here, the error detection code link 140 is disabled. Instead of receiving error codes from the memory controller, the memory device 120 generates and checks a single error correction (SEC) code internally.

Figure 8:
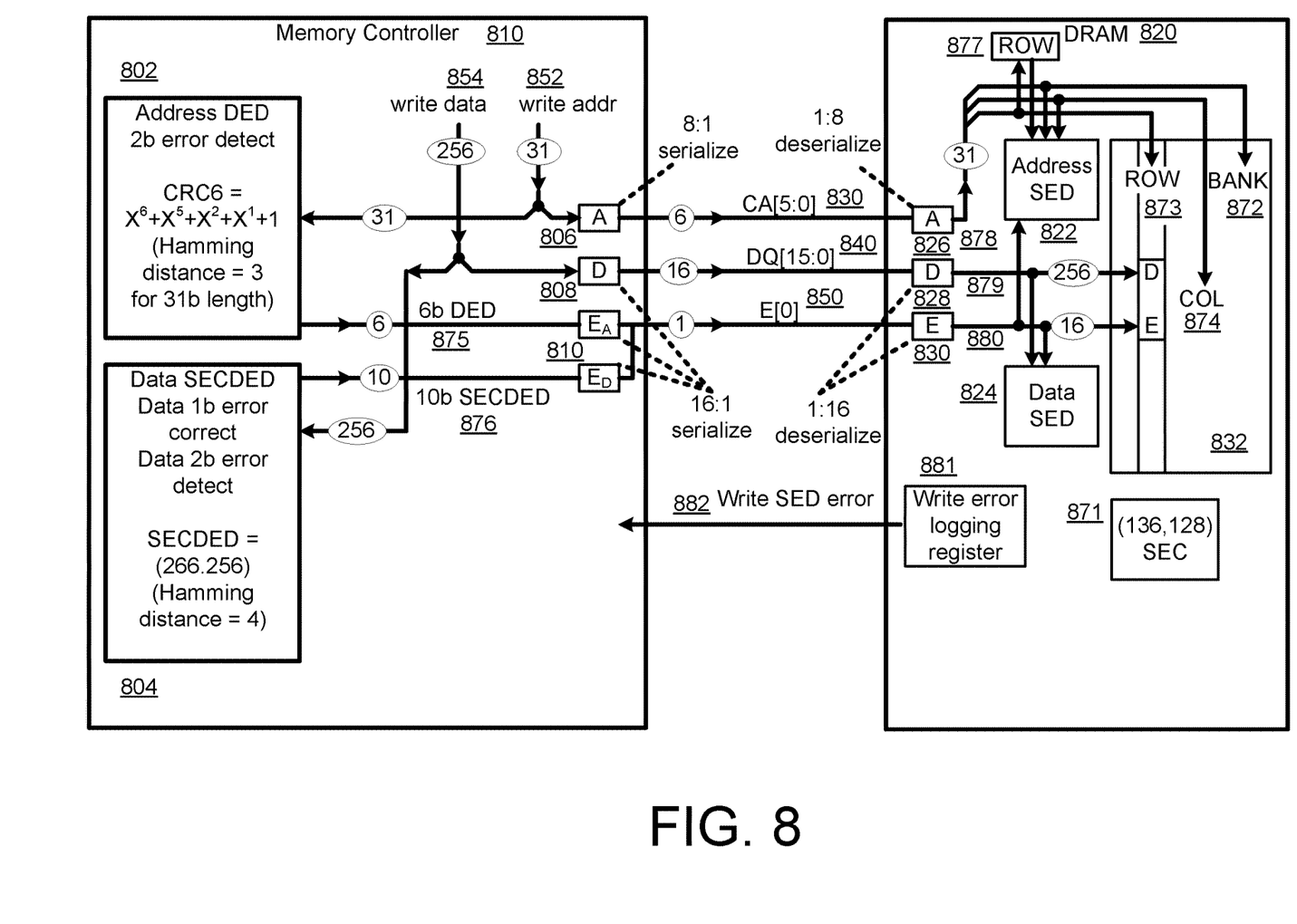
FIG. 8 is a block diagram illustrating a third example embodiment of a memory system performing a write operation.
Figure 9:
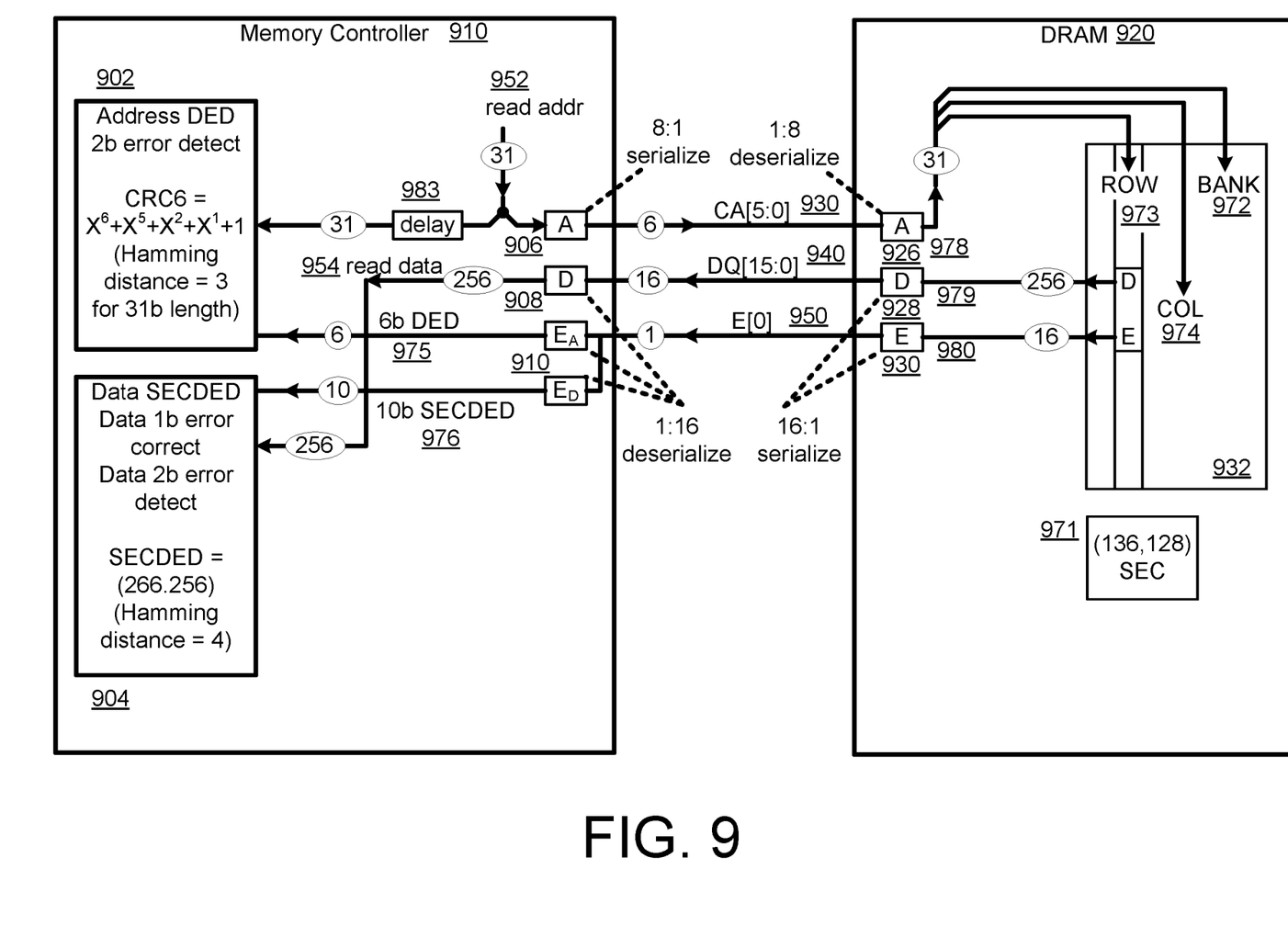
FIG. 9 is a block diagram illustrating the third example embodiment of the memory system performing a read operation.

FIGS. 8-9 illustrate a general error detect and check (EDC) method applied to a specific example memory system embodiment. The specific embodiment illustrated in FIGS. 8-9 is that of a portable memory system, using a low-power (LP) dynamic random-access memory (DRAM) component.

FIG. 8 shows the memory system in which the improved EDC methods are applied and illustrates the elements and steps for a write access from the memory controller 810 to the DRAM 820.

The write access begins when the write address 852 and write data 854 are generated in the memory controller 810 (from a queue of access requests, for example). The write address 852 includes a bank address component 872, a row address component 873, and a column address component 874. This 31 bit write address 852 is passed to the address double error detect (DED) block, where a 6 bit DED code 875 is generated.

The 6 bit DED code 875 is generated from a CRC polynomial. There are a number of CRC polynomials which could be used; the one chosen allows one or two bits errors to be detected across the 31 bits of write address 852. The 31 bits could also include the write command bits (if there is room), in addition to the write address 852.

The write data 854 includes 256 bits of data to be written to the specified column 874 of the specified row 873 of the specified bank 872 in the write address 852. This 256 bit write data 854 is passed to the data EDC block 804, where a 10 bit SECDED code 876 is generated.

The write access continues when the write address 852 and write data 854 are passed to the 8:1 serialization block 806 and to the 16:1 serialization block 808 in the memory controller interface. Also, the 6 bit DED code 875 and 10 bit SECDED code 876 are passed to the 16:1 serialization block 810 in the memory controller interface. These serialization blocks 806, 808, 810 include transmitters to drive the links CA[5:0] 830, DQ[15:0] 840, and E[0] 850. The E[0] link 850 uses the same timing and signaling as the DQ[15:0] 840 links.

The links CA[5:0] 830, DQ[15:0] 840, and E[0] 850 are received by the DRAM component 820. The CA[5:0] 830 links are received by the 1:8 deserializer 826 to re-generate the 31 bit write address 878. The DQ[15:0] 840 links are received by the 1:16 deserializer 828 to re-generate the 256 bit write data 879. The E[0] 850 link is received by the 1:16 deserializer 830 to re-generate the 16 bit error code 880.

A write access consists of a row access using the bank address 872 and row address 873. When the specified row has been accessed, a subsequent column access is performed, using the column address 874. At this point, the data 879 and error code 880 are written into the specified column location.

In a compatability mode, the single-error-correct (SEC) logic block 871 may be enabled to enable single bit data errors to be corrected on the DRAM 820 and may be usable with a memory controller that does not necessarily include error and detection and correction logic. Otherwise, the SEC logic block 871 may be disabled.

The bank address 872 and row address 873 are transported from the memory controller 810 in a first CA[5:0] 830 packet. A second bank address 872 and column address 874 are transported from the memory controller 810 in a second CA[5:0] 830 packet at a later time—after the row-column-delay (tRCD) interval.

The error code 880 is generated with both the row address 873 and column address 874. To accommodate this, a ROW register 877 is included for each bank. This register 877 holds the row address 873 currently being accessed in each bank, allowing the row address 873 to be available during the subsequent column access.

During the column access the 6b DED component of the error code 880 is compared against the 31 bit write address 878. The row address 873 is available in the ROW register 877, as previously described. The write address comparison occurs in the address SED block 822. This comparison does not perform a full double error detect, but instead uses a reduced number of logic gates to perform a SED of the write address 852 to determine if an error has occurred during transport. This is possible because the CRC polynomial code 802 enables double error detection across 31 bits, and also enables single bit error detection across the 31 bit write address using only one bit of the six bit DED code 875.

During the column access, the 10b SECDED component of the error code 880 is compared against the 256 bit write data 879. The write data comparison occurs in the data SED block 824. This comparison performs a SED of the write data 879 to determine if an error has occurred during transport. This is possible because the SECDED code 804 enables single bit error detection across the 256 bit write data using only one bit of the 10 bit SECDED code 876.

If the address SED 822 or the data SED 824 detect an error during the column write access, the write operation will be canceled. This is beneficial because a write operation to the wrong address cannot be corrected.

In addition, if an error is detected by the SED 822 or the SED 824, it is reported back to the memory controller 810. This may be implemented using a status-return link 882 from the DRAM 820 to the memory controller 810. This link 882 can have a relatively slow data rate (one bit during each column access—about $\frac{1}{16}^{th}$ the rate of the DQ[15:0] 840 links).

Alternatively, the cost of the status-return link 882 can be saved by adding an error-logging register 881 to the DRAM 820. This would save the write address 878 when an error is detected by SED 822 or SED 824. When a column read access is performed (as described below in FIG. 9) the presence of a logged SED write address or data error can be signaled (because the E[0] link transmits from the DRAM 820 to the memory controller 810).

When the memory controller 810 learns that an error was detected by SED 822 or SED 824, the column write access can be repeated. If this subsequent write operation is successful, then the memory controller 810 can continue with further accesses.

FIG. 9 shows this memory system in which the improved EDC methods are applied and illustrates the elements and steps for the memory controller 910 to perform a read access from the DRAM 920.

The read access begins when the read address 952 is generated in the memory controller 910 (from a queue of access requests, for example). The read address 952 includes a bank address component 972, a row address component 973, and a column address component 974. This 31 bit read address 952 is passed to the address DED block 902 after a delay 983 which matches the delay of the read access.

The read access continues when the read address 952 is passed to the 8:1 serialization block 906 in the memory controller interface. The serialization block 906 includes transmitters to drive the links CA[5:0] 930. The CA[5:0] links 930 are received on the DRAM 920 by the 1:8 deserializer 926 to re-generate the 31 bit write address 978.

A read access consists of a row access using the bank address 972 and row address 973. When the specified row has been accessed, a subsequent column access is performed, using the column address 974. At this point, the data 979 and error code 980 are read from the specified column location.

The DRAM component 920 may operate in a compatability mode in which an SEC logic block 971 is enabled and may be usable with a memory controller that does not necessarily include error and detection and correction logic. In the compatability mode, single bit data errors can be corrected. Otherwise, the SEC logic block 971 may be disabled.

The read access continues when the read data 979 and error code 980 are passed to the 16:1 serialization blocks 928 and 930 in the DRAM 920 interface. These serialization blocks 928, 930 include transmitters to drive the links DQ[15:0] 940, and E[0] 950. The direction of DQ[15:0] 940, and E[0] 950 are opposite to the direction for a write access.

The DQ[15:0] 940, and E[0] 950 links are received by the memory controller 910. The DQ[15:0] 940 links are received by the 1:16 deserializer 908 to re-generate the 256 bit read data 954. The E[0] 950 link is received by the 1:16 deserializer 910 to re-generate the six bit DED code 975 and the 10 bit SECDED code 976. The E[0] uses the same timing and signaling as the DQ[15:0] 940 links.

The 6 bit DED code 975 is compared to a 6 bit DED code computed from the delayed read address 952. If the address DED block 902 detects a difference, then there is a one or two bit error in the address. This error could have occurred from the time the address was generated and transported during the write access, during the time it was stored in the DRAM 920, or during the time it was transported back to the memory controller 910 during the read access. If a single bit error occurred during the transport phase of the write access, it would have already been reported by the SED block 822, as previously described.

The 10 bit SECDED code 976 is compared to a 10 bit SECDED code computed from the read data 954. If the data SECDED block 904 detects a difference, then there is a one or two bit error in the data. This error could have occurred from the time the data was generated and transported during the write access, during the time it was stored in the DRAM 920, or during the time it was transported back to the memory controller 910 during the read access. If a single bit error occurred during the transport phase of the write access, it would have already been reported by the SED block 824, as previously described.

The SECDED block 904 can correct a single bit error in the read data 954 with the information in the 10b SECDED code 976. In this case, the error is recoverable and the memory controller 910 can continue to process access requests in its queue.

The SECDED block 904 can detect a double bit error in the read data 954 with the information in the 10b SECDED code 976, but it cannot be corrected. In this case, the memory controller 910 can retry the read access to see if the read data can be accessed successfully.

Upon reading this disclosure, those of ordinary skill in the art will appreciate still alternative structural and functional designs and processes for the described embodiments, through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A memory controller comprising:
    address error code generation and detection logic to generate a write address error code encoding error information of a write address associated with a write command, and to detect a read address error based on a read address and a read address error code associated with a read command;
    data error code generation and detection logic to generate a write data error code encoding error information of write data associated with the write command, and to detect a read data error based on a read data error code and read data associated with the read command;
    a command/address interface to transmit to a memory device over a command/address link, the read command including the read address, and to transmit to the memory device over the command/address link, the write command including the write address;
    a data interface to receive over a data link from the memory device, the read data in association with the read command and to transmit over the data link to the memory device, the write data in association with the write command; and
    an error detection code interface to receive over an error detection code link from the memory device, the read address error code and the read data error code from the memory device in association with the read command and to transmit over the error detection code link to the memory device, the write address error code and the write data error code in association with the write command.

2. The memory controller of claim 1, wherein the error detection code interface is further configured transmit the write address error code and the write data error code concurrently with the data interface transmitting the write data.

3. The memory controller of claim 1, wherein the error detection code interface is further configured to receive the read address error code and the read data error code concurrently with the data interface receiving the read data.

4. The memory controller of claim 1, wherein the write address error code and the read address error code each comprise a cyclic redundancy code for at least double error detection.

5. The memory controller of claim 1,
    wherein the write address error code further encodes the error information of the write data, and wherein the write address error code comprises a cyclic redundancy code for at least triple error detection in combined bits of the write address and the write data; and
    wherein the read address error code further encodes the error information of the read data, and wherein the read address error code comprises a cyclic redundancy code for at least triple error detection in combined bits of the read address and the read data.

6. The memory controller of claim 1, wherein the write address error code comprises a parity bit for detecting a write error in one bit of the write address.

7. The memory controller of claim 1, wherein the write data error code and the read data error code each comprise a double error detection/single error correction code.

8. The memory controller of claim 1, wherein the address error code generation and detection logic is further configured to cause the command/address interface to retry the read command in response to detecting the read address error or the read data error.

9. The memory controller of claim 1, wherein the memory controller is further configured to re-transmit the write data and the write address in response to a request to retry the write command from the memory device.

10. A method for operating a memory controller comprising:
    generating, by address error code generation and detection logic, a write address error code encoding error information of a write address associated with a write command;
    generating, by data error code generation and detection logic, a write data error code encoding error information of write data associated with the write command;
    transmitting, by a command/address interface to a memory device over a command/address link, the write command including the write address;
    transmitting, by a data interface over a data link to the memory device, the write data in association with the write command;
    transmitting, by an error detection code interface over an error detection code link to the memory device, the write address error code and the write data error code in association with the write command;
    transmitting, by the command/address interface to the memory device over the command/address link, a read command including a read address;
    receiving, by the data interface over the data link from the memory device, read data in association with the read command;

receiving, by the error detection code interface over the error detection code link from the memory device, a read address error code and a read data error code from the memory device in association with the read command;

performing, by the address error code generation and detection logic, a read address error detection to detect a read address error based on the read address and the read address error code associated with the read command;

performing, by the data error code generation and detection logic, a read data error detection to detect a read data error based on the read data error code and the read data associated with the read command; and generating a detection result based on at least one of the read address error detection and the read data error detection.

11. The method of claim 10, wherein transmitting the write address error code and the write data error code occurs concurrently with transmitting the write data.

12. The method of claim 10, wherein receiving the read address error code and the read data error code occurs concurrently with receiving the read data.

13. The method of claim 10, wherein the write address error code and the read address error code each comprise a cyclic redundancy code for at least double error detection.

14. The method claim 10,
wherein the write address error code encodes error information of the write address and the write data, and wherein the write address error code comprises a cyclic redundancy code for at least triple error detection in combined bits of the write address and the write data, and
wherein the read address error code encodes error information of the read address and the read data, and wherein the read address error code comprises a cyclic redundancy code for at least triple error detection in combined bits of the read address and the read data.

15. The method of claim 10, wherein the write address error code comprises a parity bit for detecting a write error in one bit of the write address.

16. The method of claim 10, wherein the write data error code and the read data error code each comprise a double error detection/single error correction code.

17. The method of claim 10, wherein outputting the detection result comprises retransmitting the read command to the memory device in response to detecting that the read address error or the read data error is uncorrectable.

18. A memory controller comprising:
write address error code generating means for generating a write address error code encoding error information of a write address associated with a write command;
write data error code generating means for generating a write data error code encoding error information of write data associated with the write command;
write command transmitting means for transmitting to a memory device over a command/address link, the write command including the write address;
data transmitting means for transmitting to the memory device over a data link, the write data in association with the write command;
error detection code transmitting means for transmitting over an error detection code link code to the memory device, the write address error code and the write data error code in association with the write command;
read command transmitting means for transmitting to a memory device over the command/address link, a read command including a read address;
data receiving means for receiving over the data link from the memory device, read data in association with the read command;
error detection code receiving means for receiving over the error detection code link from the memory device, a read address error code and a read data error code from the memory device in association with the read command;
read address error detection means for detecting a read address error based on the read address and the read address error code associated with the read command;
read data error detection means for detecting a read data error based on the read data error code and the read data associated with the read command; and
result generating means for generating a detection result based on at least one of the read address error and the read data error.

19. The memory controller of claim 18, wherein the error detection code transmitting means transmits at least one of the write address error code and the write data error code concurrently with the data transmitting means transmitting the write data.

20. The memory controller of claim 18, wherein the error detection code receiving means receives at least one of the read address error code and the read data error code concurrently with the receiving the data receiving means receiving the read data.

* * * * *